(12) United States Patent
Cassiau et al.

(10) Patent No.: US 12,015,513 B2
(45) Date of Patent: Jun. 18, 2024

(54) OFDM MODULATOR FOR BLOCK-FILTERED OFDM TRANSMITTER, RELATED BLOCK-FILTERED OFDM TRANSMITTER AND TRANSCEIVER SYSTEM

(71) Applicant: Commissariat à l'énergie atomique et aux énergies alternatives, Paris (FR)

(72) Inventors: Nicolas Cassiau, Grenoble (FR); Marc Laugeois, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 218 days.

(21) Appl. No.: 17/304,257

(22) Filed: Jun. 17, 2021

(65) Prior Publication Data
US 2021/0409254 A1 Dec. 30, 2021

(30) Foreign Application Priority Data

Jun. 18, 2020 (FR) ...................................... 20 06354

(51) Int. Cl.
*H04L 27/26* (2006.01)
*H03M 9/00* (2006.01)
(Continued)

(52) U.S. Cl.
CPC ........ *H04L 27/26412* (2021.01); *H03M 9/00* (2013.01); *H04L 5/0007* (2013.01); *H04L 25/0218* (2013.01); *H04W 72/0453* (2013.01)

(58) Field of Classification Search
None
See application file for complete search history.

(56) References Cited

U.S. PATENT DOCUMENTS

| 8,311,568 B2 * | 11/2012 | Cho ..................... H04W 52/226 |
| | | 455/452.2 |
| 2014/0105325 A1 * | 4/2014 | Huang ............... H03H 17/0642 |
| | | 327/356 |

(Continued)

FOREIGN PATENT DOCUMENTS

EP 3 300 325 A1 3/2018

OTHER PUBLICATIONS

French Preliminary Search Report issued Mar. 4, 2021 in French Application 20 06354 filed on Jun. 18, 2020, 4 pages (with English Translation of Categories of Cited Documents).

(Continued)

Primary Examiner — Rebecca E Song
(74) Attorney, Agent, or Firm — Oblon, McClelland, Maier & Neustadt, L.L.P.

(57) ABSTRACT

An OFDM modulator including a predistortion module configured to receive the $N_c$ consecutive data carriers and configured to compensate for distortion subsequently introduced by a polyphase filter bank connectable to the output of the OFDM modulator, a transformation module configured to apply a discrete inverse Fourier transform of constant size $N_{IDFT}$ independently of the numbering and transmission band used by the OFDM transmitter including the OFDM modulator, a filling module, the input of which is connected to the output of the predistortion module, and the output of which is connected to the input of the transformation module, and configured to insert $(N_{IDFT}-N_c)$ null carriers in succession to the $N_c$ consecutive data carriers independently of the parity of the index i associated with the OFDM modulator.

9 Claims, 3 Drawing Sheets

(51) Int. Cl.
    *H04L 5/00*      (2006.01)
    *H04L 25/02*     (2006.01)
    *H04W 72/0453*   (2023.01)

(56) References Cited

U.S. PATENT DOCUMENTS

| | | | |
|---|---|---|---|
| 2014/0241211 A1* | 8/2014 | Zhang | H04L 27/26414 |
| | | | 370/255 |
| 2018/0083814 A1 | 3/2018 | Dore | |
| 2018/0175978 A1* | 6/2018 | Beidas | H04L 12/433 |
| 2020/0007361 A1* | 1/2020 | Renfors | H04L 5/0098 |

OTHER PUBLICATIONS

Demmer et al., "Block-Filtered OFDM: a novel waveform for future wireless technologies", 2017 IEEE International Conference on Communications (ICC) Wireless Communications Symposium, May 21, 2017, 6 pages.

Demmer et al., "Filter Design for 5G BF-OFDM Waveform", 2017 European Conference on Networks and Communications (EUCNC), Jun. 12, 2017, 5 pages.

Gerzaguet et al., "5G Multi-Service Field Trials with BF-OFDM", 2017 IEEE Globecom Workshops (GC WKSHPS), Dec. 4, 2017, 5 pages.

Gerzaguet et al., "Block-Filtered OFDM: A new Promising Waveform for Multi-service Scenarios", 2017 IEEE International Conference on Communications (ICC) Wireless Communications Symposium, May 21, 2017, 6 pages.

* cited by examiner

OFDM MODULATOR FOR BLOCK-FILTERED OFDM TRANSMITTER, RELATED BLOCK-FILTERED OFDM TRANSMITTER AND TRANSCEIVER SYSTEM

The present invention relates to an OFDM modulator of a set of M OFDM modulators in parallel of a block-filtered OFDM transmitter configured to communicate using a variable transmission band and numbering/ies in real time, each OFDM modulator being associated with an index i such that $0 \leq i \leq M-1$, M being constant regardless of the numbering and transmission band of said transmitter, the block-filtered OFDM transmitter further comprising upstream of said assembly a serial-to-parallel conversion module configured to convert an incoming serial data stream into $N_{FFT}$ parallel data carriers, the OFDM modulator being configured to receive as input a block of $N_c$ consecutive data carriers of said $N_{FFT}$ parallel data carriers, the OFDM modulator comprising at least one predistortion module configured to receive said $N_c$ consecutive data carriers and configured to compensate for distortion subsequently introduced by a polyphase filter bank of said OFDM transmitter, the output of said OFDM modulator being connectable to the input of the polyphase filter bank.

The present invention also relates to a block-filtered OFDM transmitter and related transceiver system.

The present invention relates generally to the field of OFDM (Orthogonal Frequency Division Multiplexing) telecommunication systems as well as that of telecommunication systems using a multi-carrier modulation with a filter bank, also known as FBMC (Filter Bank Multi-Carrier) systems.

Telecommunication systems using multi-carrier modulation are well known in the state of the art. The principle of such a modulation consists in dividing the transmission band into a plurality of frequency sub-channels associated with carriers and in modulating each of these carriers by the data to be transmitted.

The most widespread multi-carrier modulation is undoubtedly OFDM modulation, which is used in wireless local area networks (WLAN, WiFi), high-speed wireless Internet access (WiMax), digital broadcasting systems (DVB-T, ISDB-T, DAB), asymmetric digital links (xDSL), cellular networks (LTE), etc.

In an OFDM transmission system, each OFDM symbol is preceded by a guard interval, which can be a cyclic prefix, of length greater than the time spread of the channel impulse response, in order to eliminate inter-symbol interference. However, the insertion of a guard interval or a cyclic prefix leads to a loss of spectral efficiency. Finally, since the spectral occupancy of an OFDM signal is significantly larger than the carrier band it uses due to the spreading of the sidelobes, OFDM modulation is not an optimal solution for applications requiring high out-of-band rejection rates.

More recently, with the increase in digital computing capabilities, multi-carrier filter bank modulation, or FBMC, is being implemented more as an alternative to OFDM modulation. The principle of FBMC modulation is based on filter bank synthesis at the transmit end and filter bank analysis at the receiving end. The transceiver filters are frequency and time shifted versions of a prototype filter.

The invention is aimed even more specifically at the field of digital communications and specifically at the fifth generation of mobile communications, 5G, designed to meet the requirements of 2020 and beyond.

5G is not only associated with a consequent increase in data rate and capacity, but also targets new types of use such as the Internet of Things or vehicular communications. The 4G technology currently deployed does not provide enough network capacity, nor a suitable architecture, to guarantee such a diversity of use, which has motivated the search for alternative waveform solutions.

With this in mind, a promising new modulation scheme, Block-Filtered OFDM (BF-OFDM) was introduced in the paper by D. Demmer entitled "Block-Filtered OFDM: a novel waveform for future Wireless" published in IEEE ICC 2017 Wireless Communications Symposium technologies, from May 21 to 25, 2017. The block-filtered OFDM waveform is compatible with the 3GPP 5G communication standard according to version 15 and later, and indeed offers excellent frequency localization while being directly integrable from the OFDM know-how and principles associated with the 3GPP LTE communication standard. In addition, BF-OFDM systems are advantageously scalable to control network capacities on demand.

More specifically, FIG. 1 schematically illustrates the BF-OFDM transmitter 10 disclosed in the above article. Such an LF-OFDM transmitter 10 comprises two distinct successive modulation entities 12 and 14, corresponding to an OFDM pre-coding entity 12 followed by a polyphase filter bank 14 respectively. The OFDM pre-coding entity 12 comprises a chain of six distinct types of successive modules 16, 18, 20, 22, 24, and 26.

In particular, module 16 is configured to convert a serial data stream into $N_{FFT}$ parallel carriers, $N_{FFT}$ being equal to M times $N_c$ with M being the number of OFDM modulators (hereinafter referred to interchangeably as subchannels) modulating $2N_c$ carriers each, each OFDM modulator being associated with an index i such that $0 \leq i \leq M-1$, of which there are $N_c$ null carriers. Each OFDM modulator comprising an ordered sequence of modules 18, 20, 22, 24, and 26, notably integrating an Inverse Discrete Fourier Transform (IDFT) of size $2N_c$. The spectral width of an OFDM modulator (i.e. subchannel) being equal to $N_c \Delta f$, with $\Delta f$ the carrier spacing.

The modules 18 are pre-distortion type modules, each configured to compensate for distortion introduced by polyphase filter bank 14, and this for a distinct block of $N_c$ consecutive carriers from one pre-distortion module 18 to another.

The modules 20 are formatting modules, each respectively connectable to the outputs of a separate pre-distortion module 18, and each configured to distribute the received $N_c$ OFDM carriers on $2N_c$ carriers while ensuring the principle of orthogonality. Specifically, for even indexed (P) OFDM modulators, the $N_c$ data carriers are distributed along the sides of the spectrum with zero carriers in the middle of the spectrum, with the first $N_c/2$ data of the stream entering one of the formatting modules 20 under consideration placed at the end of the spectrum, while the next $N_c/2$ data of the incoming stream being placed at the beginning of the spectrum with zero carriers in the middle of the spectrum, which consequently introduces additional processing and associated hardware and architectural complexity, as well as an undesirable interruption of the data stream. For odd indexed (I) OFDM modulators, the $N_c$ data carriers are located in the middle of the spectrum with null carriers on the sides, as illustrated by Table 1 below, for a number of $N_c$ data carriers such as $N_c=32$ or $N_c=256$.

TABLE 1

|  | Nc = 32 | | |
| --- | --- | --- | --- |
| Carrier numbers | 0 to 15 | 16 to 47 | 48 to 63 |
| Edge insertion (odd sub-channel) | zeros | data 0 to 31 | Zeros |
| Middle insertion (even subchannel) | data 16 to 31 | zeros | data 0 to 15 |
|  | Nc = 256 | | |
| Carrier numbers | 0 to 127 | 128 to 383 | 384 to 511 |
| Edge insertion (odd subchannel) | zeros | data 0 to 255 | Zeros |
| Middle insertion (even subchannel) | data 128 to 256 | zeros | data 0 to 127 |

The modules 22 are each configured to apply the Inverse Discrete Fourier Transform (IDFT) of size $2N_c$ as such to the $2N_c$ carriers formatted by their respective associated formatting module 20.

The modules 24 are each configured to convert the $2N_c$ parallel time outputs of their respectively associated module 22 into a serial stream of time samples.

The modules 26 are then each configured to insert a cyclic prefix into the serial stream of the block of temporal samples received from their associated module 24, the cyclic prefix corresponding to a copy of the last $N_{cp}$ temporal samples of the block of temporal samples received at the beginning thereof.

The M blocks of temporal samples delivered by the M OFDM modulators are then filtered by the PolyPhase Network (PPN) filter bank 14.

However, because the set of communication parameters associated with 5G is much larger than that associated with 4G, to manage the diversity of use targeted, the hardware implementation of such a LF-OFDM transmitter is complex and resource intensive while the associated hardware, particularly in the form of a programmable logic component, such as an FPGA (Field Programmable Gate Array) is limited in resources.

Indeed, 5G is characterized in particular by a transmission band and a numbering $\mu=\{0, 1, 2, 3\}$ (number associated with a predetermined value of the space between carriers $\Delta f$), both of which vary respectively and independently in real time, as illustrated in particular by Table 2 below, illustrating different parameterizations of the LF-OFDM transmitter considering a constant number M of OFDM modulators (i.e. sub-channels); the width of which evolves with the bandwidth B of the transmission band:

TABLE 2

|  |  | B = 50 MHz $N_c \Delta f$ = 3.84 MHz | | | B = 100 MHz $N_c \Delta f$ = 7.68 MHz | | | B = 200 MHz $N_c \Delta f$ = 15.36 MHz | | |
| --- | --- | --- | --- | --- | --- | --- | --- | --- | --- | --- |
| μ | Δf (kHz) | $N_c$ | IDFT Size | $N_{cp}$ | $N_c$ | IDFT Size | $N_{cp}$ | $N_c$ | IDFT Size | $N_{cp}$ |
| 0 | 15 | 256 | 512 | 32 | 512 | 1024 | 64 | 1024 | 2048 | 128 |
| 1 | 30 | 128 | 256 | 16 | 256 | 512 | 32 | 512 | 1024 | 64 |
| 2 | 60 | 64 | 128 | 8 | 128 | 256 | 16 | 256 | 512 | 32 |
| 3 | 120 | 32 | 64 | 4 | 64 | 128 | 8 | 128 | 256 | 16 |

The transmitter architecture disclosed in the previously cited article illustrated by FIG. 1 is not adapted to the HDL (Hardware Description Language) because, depending on the numbering and the band, likely to change in real time, the $N_c$ parameters, and thus the size $2N_c$ of the IDFT and $N_{cp}$ vary, involving several hardware problems of implementation on FPGA, namely the need to implement several IDFT sizes and switch to one or other implementation depending on the numbering, to adapt the HDL hardware description code according to the cyclic prefix size, and especially the description complexity of the formatting module 20.

Indeed, as previously indicated, depending on the indexed parity of the modulator (i.e. sub-channel) considered, the null carriers to be inserted are located in the middle of the spectrum for even indexed OFDM modulators, which leads to an interruption of the data flow, or at the ends of the spectrum for odd indexed OFDM modulators. Moreover, if we consider a linear data input order (i.e. from indexed 0 to $N_c-1$), for odd indexed OFDM modulators, this order is preserved, whereas for even indexed modulators, it is appropriate to output first the data from indexed $N_c/2$ to $N_c-1$ and then those from indexed 0 to $N_2/2-1$. In summary, the order of readout from the modulator buffer differs, depending on parity.

With such an insertion/reversal of data order varying based on the indexed parity of the modulator (i.e. subchannel) considered, is difficult to achieve in HDL hardware description language in the targeted 5G application context where, moreover, depending on the numbering and band, likely to change in real time, the parameters $N_c$ and thus the size $2N_c$ of the IDFT vary, or requires as many programmable logic components, such as a FPGA (Field Programmable Gate Array) as envisaged transmission configurations which would drastically increase the load and cost of such a transmitter.

The purpose of the present invention is therefore to propose a variant implementation of a BF-OFDM transmitter and of the corresponding transceiver system which takes into account the complexity of a hardware implementation, namely adapted to the HDL hardware description language, allowing in particular an FPGA implementation.

To this end, the invention relates to an OFDM modulator of a set of M OFDM modulators in parallel with a block-filtered OFDM transmitter configured to communicate using a transmission band and a numbering system, variable in real time, each OFDM modulator being associated with an index i such that $0 \le i \le M-1$, M being constant independently of the numbering and the transmission band of said transmitter, the block-filtered OFDM transmitter further comprising a serial-to-parallel conversion module upstream of said assembly, configured to convert an incoming serial data stream into $N_{FFT}$ parallel data carriers, the OFDM modulator being configured to receive as input a block of $N_c$ consecutive data carriers of said $N_{FFT}$ parallel data carriers, the OFDM modulator comprising at least one predistortion module configured to receive said $N_c$ consecutive data carriers and configured to compensate for distortion subsequently introduced by a polyphase filter bank of said OFDM transmitter, the output of said OFDM modulator being connectable to the input of the polyphase filter bank, the OFDM modulator further comprising:

a transformation module configured to apply a discrete inverse Fourier transform IDFT of constant size $N_{IDFT}$ independently of the numbering and transmission band of said transmitter, a filler module the input of which is connected to the output of the predistortion module, and the output of which is connected to the input of the transformation module, the filler module being configured to insert ($N_{IDFT}-N_c$) null carriers following the $N_c$ consecutive data carriers independently of the parity of the indexed i associated with said OFDM modulator.

According to other advantageous aspects of the invention, the OFDM modulator comprises one or more of the following features, taken alone or in any technically possible combination:
- the OFDM modulator is configured to process the data according to its arrival order independently of the value of its indexed i;
- the OFDM modulator further comprises:
  - a parallel-serial conversion module configured to convert the $N_{IDFT}$ parallel time outputs suitable to be delivered by the transformation module into a serial stream of time samples, and
  - an insertion module, the input of which is configured to be connected to the output of the parallel-serial conversion module, the insertion module being configured to insert a guard time, corresponding to a predetermined number N of additional time samples constant independently of the numbering and the transmission band of said transmitter;
- the guard time corresponds to a cyclic prefix;
- the guard time corresponds to a cyclic suffix;
- the OFDM modulator further comprises a decimation module, located downstream of said transformation module, the decimation module being configured to decimate the time samples obtained from said transformation module by a factor equal to $N_{IDFT}/(2N_c)$;
- the OFDM modulator further comprises a spectrum shifting module configured to apply to the samples, in their order of arrival, a rotation in the time domain of value $(-1)^{i+1}\pi/2$, with i the indexed associated with said OFDM modulator;

It is also an object of the invention to have a block-filtered OFDM transmitter configured to communicate using a variable transmission band and numbering in real time, the OFDM transmitter comprising successively:
- a serial-to-parallel conversion module configured to convert an incoming serial data stream into $N_{FFT}$ parallel data carriers,
- a set of M parallel OFDM modulators according to any one of the preceding claims, each OFDM modulator being associated with an indexed i such that $0 \leq i \leq M-1$, M being constant independently of the numbering and transmission band of said transmitter, each OFDM modulator being configured to receive as input a set of $N_c$ consecutive data carriers of said $N_{FFT}$ parallel data carriers, the sets of $N_c$ consecutive carriers processed by each modulator being all disjoint, $N_{FFT}$ being equal to M times $N_c$,
- a polyphase filter bank configured to connect to the M outputs of said set of M OFDM modulators.

According to another advantageous aspect of the block filtering OFDM transmitter, the number M of OFDM modulators is reconfigurable.

It is also an object of the invention to provide a transceiver comprising a block-filtered OFDM transmitter according to the present invention.

These features and advantages of the invention will become clearer upon reading the following description, given only as a non-limiting example, and made with reference to the attached drawings, in which.

Figure 1:
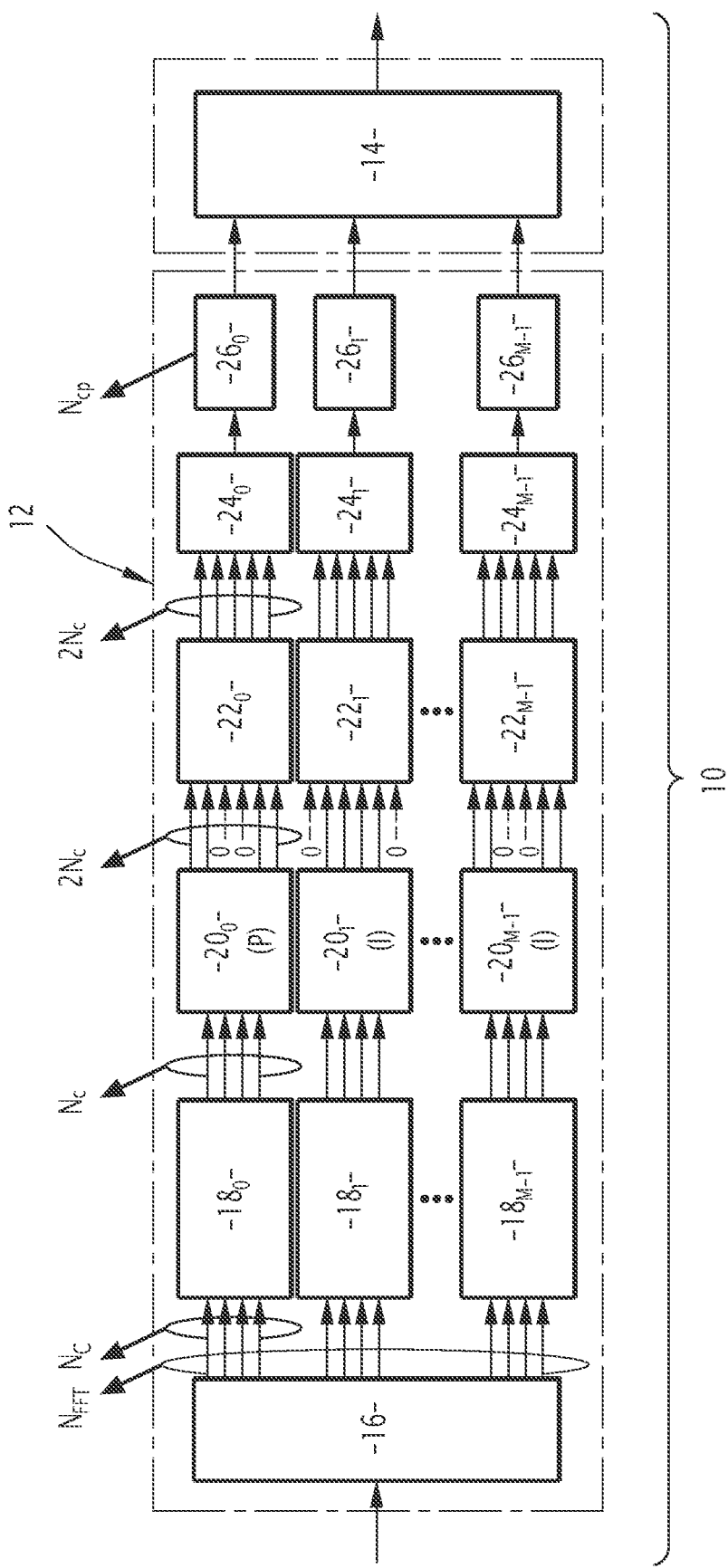
FIG. 1 is a schematic representation of a block-filtered OFDM transmitter according to the prior art described above.
Figure 2:
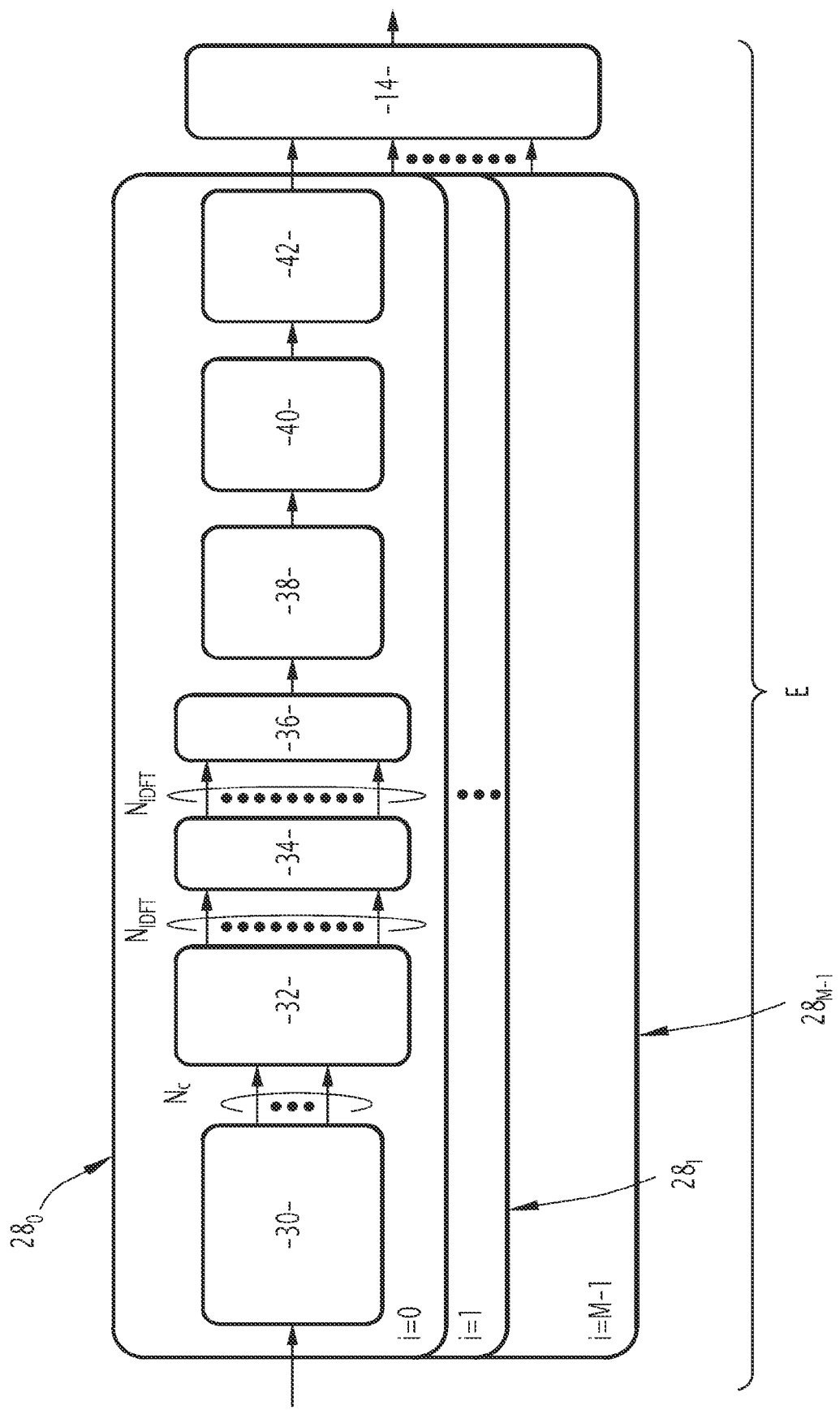
FIG. 2 is a schematic representation of a block-filtered OFDM transmitter according to the present invention.

FIG. 2 is a schematic representation of a block-filtered OFDM transmitter E according to the present invention. More specifically, the block-filtered OFDM transmitter E is configured to communicate using a variable transmission band and numbering in real time, the OFDM transmitter E comprising successively, a serial-to-parallel conversion module 16, as previously illustrated by FIG. 1, configured to convert an incoming serial data stream into $N_{FFT}$ parallel data carriers, followed, as illustrated by FIG. 2, by a set of M OFDM modulators $28_0$, $28_1$, ..., $28_i$, ..., $28_{M-1}$ in parallel, each OFDM modulator being associated with an indexed i such that $0 \leq i \leq M-1$, M being constant independently of the numbering and transmission band of said transmitter E, the set of M OFDM modulators $28_0$, $28_1$, ..., $28_i$, ..., $28_{M-1}$ in parallel being itself followed by a bank 14 of polyphase filters configured to connect to the M outputs of said set of M OFDM modulators.

Each OFDM modulator 280, 281, ..., 28i, ..., 28$_{M-1}$ is configured to receive as input a set of $N_c$ consecutive data carriers of said $N_{FFT}$ parallel data carriers, the sets of $N_c$ consecutive carriers processed by each modulator $28_0$, $28_1$, ..., $28_i$, ..., $28_{M-1}$ being all disjoint, $N_{FFT}$ being equal to M times $N_c$.

More specifically, as illustrated in FIG. 2, each OFDM modulator, in particular OFDM modulator $28_0$, includes a predistortion module 30 configured to receive said $N_c$ consecutive data carriers and configured to compensate for distortion subsequently introduced by polyphase filter bank 14 of said E OFDM transmitter, the output of said OFDM modulator being connectable to the input of polyphase filter bank 14.

Each OFDM modulator, in particular OFDM modulator 280, further comprises a filling module 32, the input of which is connected to the output of predistortion module 30, and the output of which is connected to the input of a transformation module 34 configured to apply a discrete inverse Fourier transform IDFT of constant size $N_{IDFT}$ independently of the numbering and transmission band of said transmitter. The filling module 32 is configured to insert ($N_{IDFT}-N_c$) null carriers (hereinafter referred to as zeros carrying null-valued data) following the $N_c$ consecutive data carriers regardless of the parity of the indexed i associated with said considered OFDM modulator.

In other words, the filling module 32 is dedicated to inserting zeros, using a unique insertion scheme of ($N_{IDFT}-N_c$) zeros, with the zeros inserted after $N_c$ data. Furthermore, the data is processed in its order of arrival independently of the parity of the indexed i associated with said OFDM modulator under consideration, (i.e. regardless of the sub-channel), which solves the flow interruption problem associated with the transmitter architecture previously described in relation to FIG. 1, since each OFDM modulator $28_0$, $28_1$, ..., $28_i$, ..., $28_{M-1}$, is then conducive to processing the data according to its order of arrival independently of the value of its indexed i.

Thus, the filling module 32 plays a double role, that is, adding the $N_c$ null carriers, to allow to guarantee the orthogonality principle on the one hand, and on the other hand, filling the input of the discrete inverse Fourier transform IDFT with ($N_{IDFT}-2N_c$) zeros (i.e. additional null carriers) to use only one size $N_{IDFT}$ of discrete inverse Fourier transform IDFT regardless of numbering and transmission band.

An example of filling zero carriers (i.e. zeros) is illustrated by Table 3 below for a number $N_c$ of data carriers such as $N_c=32$ and $N_c=256$ and with a constant size $N_{IDFT}$ of discrete inverse Fourier transform IDFT such as: $N_{IDFT}=512$ regardless of numbering and transmission band.

TABLE 3

| | $N_c = 32$ | |
|---|---|---|
| Carrier number (independently of the parity of the indexed i associated with said OFDM modulator (i.e. sub-channel)) | 0 to 31 | 32 to 511 |
| Data number | 0 to 31 | Inserted zeros |
| | $N_c = 256$ | |
| Carrier number (independently of the parity of indexed i associated with said OFDM modulator (i.e. sub-channel)) | 0 to 255 | 256 to 511 |
| Data number | 0 to 255 | Inserted zeros |

The transformation module 34 configured to apply a discrete inverse Fourier transform IDFT is, according to the present invention, configured to perform an IDFT of constant size $N_{IDFT}$ (regardless of numbering and band). The zero-filling implemented by the filling module 32 at the input of the discrete inverse Fourier transform IDFT (frequency domain) corresponds to an oversampling of the signal in the time domain by a factor equal to: $N_{IDFT}/(2N_c)$.

Each OFDM modulator $28_0, 28_1, \ldots, 28_i, \ldots, 28_{M-1}$ further comprises, as illustrated in FIG. 2, a parallel-to-serial conversion module 36 configured to convert the $N_{IDFT}$ parallel time outputs configured to output from the transformation module 34 into a serial stream of time samples.

Furthermore, each OFDM modulator $28_0, 28_1, \ldots, 28_i, \ldots, 28_{M-1}$ further comprises an insertion module 38, the input of which is suitable to be connected to the output of the parallel-to-serial conversion module 36, the insertion module 38 being configured to insert a guard time, corresponding to a predetermined number $N_{cs}$ of additional temporal samples constant independently of the numbering and the transmission band of said transmitter E.

According to a first variant, the guard time corresponds to a cyclic prefix.

According to a second variant, the guard time corresponds to a cyclic suffix.

Furthermore, each OFDM modulator $28_0, 28_1, \ldots, 28_i, \ldots, 28_{M-1}$ further comprises a decimation module 40, located downstream of said transformation module 34, the decimation module 40 being configured to decimate the time samples obtained from said transformation module 34 by the factor equal to $N_{IDFT}/(2N_c)$. Such decimation allows the desired timing to be recovered.

Examples of decimation for a constant size $N_{IDFT}$ of discrete inverse Fourier transform IDFT such as: $N_{IDFT}=512$ or $N_{IDFT}=1024$ regardless of numbering and transmission band are illustrated in particular by table 4 below.

TABLE 4

| $N_c$ | Number of zeros | $N_{IDFT}$ | Decimation |
|---|---|---|---|
| 32 | 480 | 512 | 8 |
| 64 | 448 | | 4 |
| 128 | 384 | | 2 |
| 256 | 256 | | None |
| 64 | 960 | 1024 | 8 |
| 128 | 896 | | 4 |
| 256 | 768 | | 2 |
| 512 | 512 | | None |

In addition, each OFDM modulator $28_0, 28_1, \ldots, 28_i, \ldots, 28_{M-1}$ further comprises a spectrum shifting module 42 configured to apply a time domain rotation of value $(-1)^{i+1}\pi/2$ to the samples, in their arrival order, with i the indexed associated with said OFDM modulator.

Figure 3:
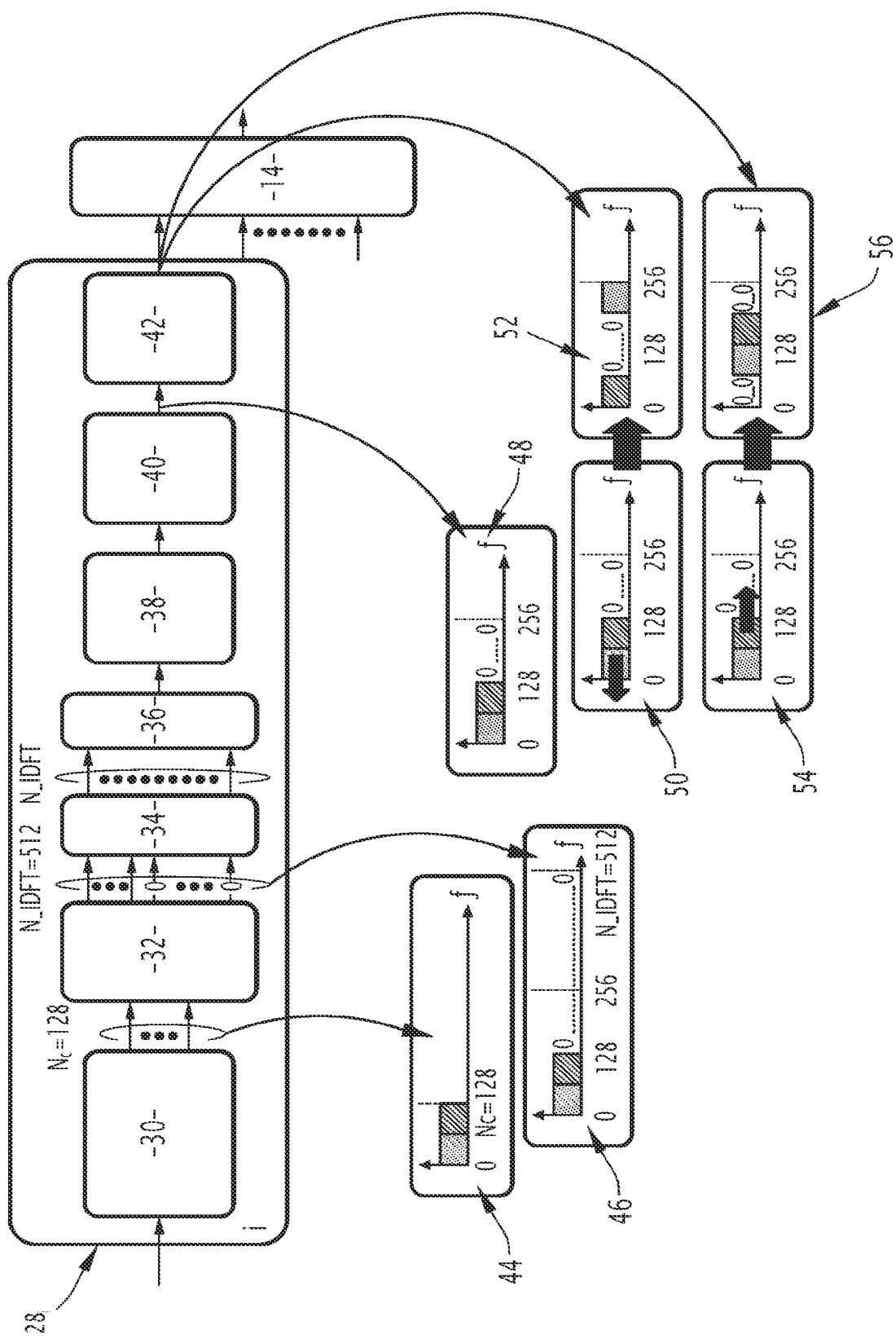
FIG. 3 is a schematic representation of the processing implemented by one of the OFDM modulators of the block-filtered OFDM transmitter according to the present invention.

Such a spectrum shifting module 42 (i.e., time domain rotation module 42) associated with the previously described filling module 32, enables reproduction of the formatting, as illustrated in FIG. 3, at the output of each OFDM modulator $28_0, 28_1, \ldots, 28_i, \ldots, 28_{M-1}$ according to the present invention, examples of which are indicated in Table 1, with the major difference that the proposed modulator architecture according to the present invention does not require any data flow interruption.

More precisely, in FIG. 3, for a number $N_c$ of data carriers such that $N_c=128$, as illustrated by representation 44, and with a constant size $N_{IDFT}$ of discrete inverse Fourier transform IDFT such that: $N_{IDFT}=512$ regardless of numbering and transmission band implemented by the transformation module 34, the filling module 32 inserts a number of null carriers equal to 512−128=384, following the $N_c=128$ consecutive data carriers, independently of the parity of the indexed i associated with said OFDM modulator $28_0, 28_1, \ldots, 28_i, \ldots, 28_{M-1}$, as illustrated by representation 46.

Then, as illustrated by representation 48 of FIG. 3, the decimation processing implemented by the decimation module 40 in the time domain, returns to the reduction of the spectrum in the frequency domain by a factor of two, to obtain 256 carriers with always $N_c$ first consecutive data carriers such that $N_c=128$ and 128 following null carriers.

The processing implemented by the spectrum shifting module 42 is illustrated by the frequency domain representations 50 and 52 for an even indexed i OFDM (i.e. sub-channel) modulator, and 54 and 56 for an odd indexed i OFDM (i.e., subchannel) modulator.

Specifically, the spectrum shifting module 42 implements a rotation in the time domain of value $(-1)^{i+1}\pi/2$, with i the indexed associated with said OFDM modulator, so that for an even indexed i, such a rotation in the time domain amounts to distributing, as illustrated by embodiments 50 and 52, in the frequency domain, the $N_c$ data carriers on the sides of the spectrum with 128 null carriers in the middle of the spectrum, the first $N_c/2=64$ data (represented with a dashed texture) of the incoming stream being placed at the end of the spectrum, while the next $N_c/2=64$ data (represented with a diagonal texture) of the incoming stream being placed at the beginning of the spectrum with null carriers in the middle of the spectrum. For an odd indexed i, such a rotation in the time domain amounts to distributing, as shown in representations 54 and 56, in the frequency domain the $N_c$ data carriers in the center of the spectrum with null carriers on the sides.

In other words, avoiding an interruption of the data stream, the right or left shift of the spectrum according to the subchannel indexed parity is controlled, according to the present invention, simply by the sign of the rotation implemented by the spectrum shifting module 42. This spectrum shifting module 42 uses the property that a rotation in the time domain is equivalent to a spectral shift.

With the architecture of the transmitter E proposed according to the present invention, the various parameterizations of the LF-OFDM transmitter considering a constant number M of OFDM modulators (i.e. subchannels), the width of which evolves with the bandwidth B of the transmission band, become the parameterizations illustrated by table 5 presented below, with a transmission band and a numbering μ={0, 1, 2, 3} (number associated with a predetermined value of the inter-carrier space Δf) both able to vary respectively and independently in real time:

TABLE 5

| μ | Δf (kHz) | Band = 50 MHz $N_c \Delta f$ = 3.84 MHz | | | Band = 100 MHz $N_c \Delta f$ = 7.68 MHz | | | Band = 200 MHz $N_c \Delta f$ = 15.36 MHz | | |
|---|---|---|---|---|---|---|---|---|---|---|
| | | $N_c$ | IDFT Size | $N_{cs}$ | $N_c$ | IDFT Size | $N_{cs}$ | $N_c$ | IDFT Size | $N_{cs}$ |
| 0 | 15 | 256 | 2048 | 128 | 512 | 2048 | 128 | 1024 | 2048 | 128 |
| 1 | 30 | 128 | | | 256 | | | 512 | | |
| 2 | 60 | 64 | | | 128 | | | 256 | | |
| 3 | 120 | 32 | | | 64 | | | 128 | | |

In comparison with Table 2 presented in relation to the prior art, the architecture of the E transmitter according to the present invention, regardless of numbering and band, is therefore characterized by both a single discrete inverse Fourier transform size IDFT ($N_{IDFT}$) and a single guard interval size $N_{cs}$ used.

The architecture of the transmitter E according to the present invention thus allows for simplification of the alternation of the position of the zeros during the formatting implemented according to the state of the art, thanks to the filling module 32 previously described, completed by the action in the time domain of the decimation module 40 and the spectrum shifting module 42 (or even rotation module in the time domain). The insertion of zeros (i.e. zero carriers), implemented by the filling module 32, no longer requires any indexing operation according to the sub-channel parity and does not require interrupting the data flow.

The person skilled in the art will understand that the invention is not limited to the embodiments described, nor to the particular examples of the description, as the above-mentioned embodiments and variants are suitable to be combined with each other to generate new embodiments of the invention.

In particular, the OFDM modulator architecture $28_0$, $28_1$, ..., $28_i$, ..., $28_{M-1}$ proposed in FIG. 2, applies for any M value: the system designers choose M according to their own objectives. In other words, the number M of OFDM modulators $28_0$, $28_1$, ..., $28_i$, ..., $28_{M-1}$ is reconfigurable, this parameter M having an influence on the size of the filter bank 14 and on the size of the Fast Fourier Transform (FFT) of the receiver of a transceiver system, not shown, comprising a block-filtered OFDM transmitter E according to the present invention. The width M of the subchannels (i.e. OFDM modulator $28_0$, $28_1$, ..., $28_i$, ..., $28_{M-1}$) is a parameter of the OFDM E-transmitter suitable for development, such development being supported by the invention.

The present invention thus proposes an E OFDM transmitter architecture, in particular compatible with version 15 of the 3GPP standard, 5G NR, which makes it likely to be used by any system claiming this standard, in particular so-called "multi-service" systems, mixing services with different requirements in the same frame, particularly suitable for using BF-OFDM.

The invention claimed is:

1. An OFDM modulator of a set of M OFDM modulators in parallel with a block-filtered OFDM transmitter configured to communicate using a transmission band and a numbering that is variable in real time,
    each OFDM modulator of the set of M OFDM modulators being associated with an index i such that 0≤i≤M−1, M being constant, independently of the numbering and the transmission band of said block-filtered OFDM transmitter,
    the block-filtered OFDM transmitter further comprising a serial-to-parallel conversion module, upstream of said set of M OFDM modulators, configured to convert an incoming serial data stream into $N_{FFT}$ parallel data carriers,
    the OFDM modulator being configured to receive a block of $N_c$ consecutive data carriers of said $N_{FFT}$ parallel data carriers as input,
    the OFDM modulator comprising at least one predistortion module configured to receive said $N_c$ consecutive data carriers and configured to compensate for distortion subsequently introduced by a polyphase filter bank of said block-filtered OFDM transmitter, an output of the OFDM modulator being connectable to an input of the polyphase filter bank,
    wherein the OFDM modulator further comprises:
        a transformation module configured to apply a discrete inverse Fourier transform IDFT of constant size $N_{IDFT}$ independently of the numbering and the transmission band of said block-filtered OFDM transmitter,
    a filling module, an input of which is connected to an output of the predistortion module, and an output of which is connected to an input of the transformation module, the filling module being configured to insert ($N_{IDFT}$−$N_c$) null carriers in succession to the $N_c$ consecutive data carriers independently of a parity of an index i associated with said OFDM modulator, and
    a decimation module, located downstream of the transformation module, the decimation module being configured to decimate time samples obtained from the transformation module by a factor equal to $N_{IDFT}/(2N_c)$.

2. The OFDM modulator according to claim 1, wherein each OFDM modulator is configured to process data according to an order of arrival of the data, independently of the value of the index i of the modulator.

3. The OFDM modulator according to claim 1, further comprising:
    a parallel-to-serial conversion module configured to convert $N_{IDFT}$ parallel time outputs output from the transformation module into a serial stream of time samples, and
    an insertion module, an input of which is configured to be connected to an output of the parallel-to-serial conversion module, the insertion module being configured to insert a guard time, corresponding to a predetermined number $N_{cs}$ of additional time samples, $N_{cs}$ being constant, independently of the numbering and the transmission band of said block-filtered OFDM transmitter.

4. The OFDM modulator according to claim 3, wherein the guard time corresponds to a cyclic prefix.

5. The OFDM modulator according to claim 3, wherein the guard time corresponds to a cyclic suffix.

6. A block-filtered OFDM transmitter configured to communicate using a variable transmission band and a numbering that is variable in real time, the OFDM transmitter comprising:
- a serial-to-parallel conversion module configured to convert an incoming serial data stream into $N_{FFT}$ parallel data carriers,
- a set of M OFDM modulators, each OFDM modulator being associated with an index i such that $0 \leq i \leq M-1$, M being constant regardless of the numbering and the variable transmission band of the block-filtered OFDM transmitter, each OFDM modulator being configured to receive as input a block of $N_c$ consecutive data carriers of said $N_{FFT}$ parallel data carriers, the blocks of $N_c$ consecutive carriers being processed by each modulator being all disjoint, $N_{FFT}$ being equal to M times $N_c$, and
- a polyphase filter bank configured to be connected to M outputs of said set of M OFDM modulators, wherein each OFDM modulator further comprises:
- a transformation module configured to apply a discrete inverse Fourier transform IDFT of constant size $N_{IDFT}$ independently of the numbering and the transmission band of the block-filtered OFDM transmitter,
- a filling module, an input of which is connected to an output of the predistortion module, and an output of which is connected to an input of the transformation module, the filling module being configured to insert ($N_{IDFT}-N_c$) null carriers in succession to the $N_c$ consecutive data carriers independently of a parity of an index i associated with said OFDM modulator, and
- a decimation module, located downstream of the transformation module, the decimation module being configured to decimate time samples obtained from the transformation module by a factor equal to $N_{IDFT}/(2N_c)$.

7. The block-filtered OFDM transmitter according to claim 6, wherein the number M of OFDM modulators is reconfigurable.

8. A transceiver comprising the block-filtered OFDM transmitter according to claim 7.

9. An OFDM modulator of a set of M OFDM modulators in parallel with a block-filtered OFDM transmitter configured to communicate using a transmission band and a numbering that is variable in real time,
- each OFDM modulator of the set of M OFDM modulators being associated with an index i such that $0 \leq i \leq M-1$, M being constant, independently of the numbering and the transmission band of the block-filtered OFDM transmitter,
- the block-filtered OFDM transmitter further comprising a serial-to-parallel conversion module, upstream of the set of M OFDM modulators, configured to convert an incoming serial data stream into $N_{FFT}$ parallel data carriers,
- the OFDM modulator being configured to receive a block of $N_c$ consecutive data carriers of the $N_{FFT}$ parallel data carriers as input,
- the OFDM modulator comprising at least one predistortion module configured to receive the $N_c$ consecutive data carriers and configured to compensate for distortion subsequently introduced by a polyphase filter bank of the block-filtered OFDM transmitter, an output of the OFDM modulator being connectable to an input of the polyphase filter bank,
- wherein the OFDM modulator further comprises:
  - a transformation module configured to apply a discrete inverse Fourier transform IDFT of constant size $N_{IDFT}$ independently of the numbering and the transmission band of the block-filtered OFDM transmitter,
  - a filling module, an input of which is connected to an output of the predistortion module, and an output of which is connected to an input of the transformation module, the filling module being configured to insert ($N_{IDFT}-N_c$) null carriers in succession to the $N_c$ consecutive data carriers independently of a parity of an index i associated with the OFDM modulator, and
  - a spectrum shifting module configured to apply, to samples, in the order of arrival, a rotation in a time domain of a value of $(-1)^{i+1}\pi/2$, where i is the index associated with the OFDM modulator.

* * * * *